United States Patent [19]

Miller, Jr. et al.

[11] Patent Number: 5,691,652
[45] Date of Patent: Nov. 25, 1997

[54] COMPLETION DETECTION AS A MEANS FOR IMPROVING ALPHA SOFT-ERROR RESISTANCE

[75] Inventors: Robert H. Miller, Jr.; John R. Spencer, both of Loveland, Colo.

[73] Assignee: Hewlett-Packard Co., Palo Alto, Calif.

[21] Appl. No.: 603,977

[22] Filed: Feb. 20, 1996

[51] Int. Cl.$^6$ .................... H03K 19/096; H03K 17/16
[52] U.S. Cl. .................. 326/26; 326/21; 326/93; 326/98
[58] Field of Search .................... 326/9, 21, 93, 326/95, 98, 26–28, 119, 121, 31, 34

[56] References Cited

U.S. PATENT DOCUMENTS

| | | |
|---|---|---|
| 4,506,436 | 3/1985 | Bakeman, Jr. et al. . |
| 4,604,639 | 8/1986 | Kinoshita . |
| 5,065,048 | 11/1991 | Asai et al. .................... 326/34 |
| 5,208,490 | 5/1993 | Yetter . |
| 5,224,208 | 6/1993 | Miller, Jr. et al. . |
| 5,317,204 | 5/1994 | Yetter et al. . |
| 5,329,176 | 7/1994 | Miller, Jr. et al. . |
| 5,343,096 | 8/1994 | Heikes et al. . |
| 5,389,835 | 2/1995 | Yetter . |
| 5,390,134 | 2/1995 | Heikes et al. . |
| 5,392,423 | 2/1995 | Yetter . |
| 5,565,798 | 10/1996 | Durham et al. .................... 326/93 |

OTHER PUBLICATIONS

Hsieh, C. M., Murley, P. C., and O'Brien, R. R., "Dynamics of Charge Collection from Alpha–Particle Tracks in Integrated Circuits", IEEE/Proc. IRPS, Jun. 1981, pp. 38–42.

McLean, F.B., and Oldham, T.R., "Charge Funneling in N-and P-Type SI Substrates", IEEE Transactions on Nuclear Science, vol. NS-29, No. 6, Dec. 1982, pp. 2018–2023.

*Primary Examiner*—Edward P. Westin
*Assistant Examiner*—Jon Santamauro

[57] ABSTRACT

A system and method for improving alpha-particle induced soft error rates in integrated circuits is provided. Logic isolation circuits implemented using a substantially fewer number of pn-junctions are situated at the outputs of fast logic portions containing a substantially greater number of pn-junctions. The present invention reduces the vulnerability of a dynamic logic circuit of incurring alpha soft errors by effectively trading the probability of an isolation circuit composed of only a few pn-junctions incurring alpha-particle strikes with the probability of a fast logic circuit having substantially more pn-junctions incurring alpha-particle strikes. By reducing the number of pn-junctions susceptible to alpha-particle strikes, the present invention significantly lowers the potential alpha-particle induced soft error rate. In one embodiment, isolation circuits used in the present invention are implemented using self-timed logic, to reduce the window in which a circuit is logically vulnerable to alpha strikes, in which a loss of state can occur.

11 Claims, 8 Drawing Sheets

COMPLETION DETECTION AS A MEANS FOR IMPROVING ALPHA SOFT-ERROR RESISTANCE

FIELD OF THE INVENTION

The present invention relates generally to dynamic logic and, more particularly, to a system and method for reducing soft error rates in dynamic logic due to alpha-particle strikes.

BACKGROUND OF THE INVENTION

Dynamic logic gates are used in the conventional design of logic circuits which require high performance and modest size. Dynamic logic gates are much faster than static logic gates. Essentially, a dynamic logic gate is a circuit which requires a periodic electrical precharge, or refresh, such as with a dynamic random access memory (DRAM), in order to maintain and properly perform its intended logic function. Once the electrical precharge on the dynamic logic gate has been discharged, the dynamic logic gate can perform no other logic functions until subsequently precharged.

However, the use of conventional dynamic logic circuits in the construction of logic networks is problematic. Dynamic logic gates can be unreliable as a result of alpha-particle induced soft errors. Alpha-particle soft-errors occur when a semiconductor is exposed to extremely small quantities (on the order of, for example, parts per million) of uranium (U) or thorium (Th) contained in ceramic, glass, metals, or plastic filler semiconductor packaging materials.

Logic gates are formed via pn-junctions in semiconductors. When an alpha-particle strikes a pn-junction, as illustrated in FIG. 1, enhanced charge collection drastically distorts the junction field. The field, which is normally limited to the depletion region, extends radially into the bulk silicon along the length of the alpha-particle track, forming a "funnel". The alpha particles penetrate the oxide film, polysilicon layers, and aluminum conductive layer of a semiconductor device to reach the silicon semiconductor substrate, and collide against Si crystals to form electron-hole pairs. Some of the minority carriers (electrons, for n-channel devices having a p-type substrate) of the electron-hole pairs are stored in a depletion layer at the surface portion of the semiconductor substrate forming one electrode of the capacitor of the memory cell, and change a logic level "1" (minority carrier is absent) at the pn-junction to a logic level "0". At this time, the majority carriers (holes, for n-channel devices) flow to the substrate. Within less than a nanosecond, the field returns to its normal depletion-layer position, thereby invoking its label as a "soft" error.

Alpha-particle induced soft errors are becoming a serious problem in view of the recent tendency toward increasingly dense integrated logic circuits. The increase in the number of logic cells per unit area increases the probability that the logic circuit shall be struck by an alpha-particle, thereby increasing the alpha-particle induced soft error rate.

Proposed remedies to alpha particle induce soft errors include designing alpha particle immunity into circuits, reducing the amount of radioactive materials present in packaging materials, and the shielding of sensitive devices areas with coatings which absorb, but do not emit, alpha particles. One such solution is described in U.S. Pat. No. 4,604,639 to Kinoshita, whereby alpha-particle induced soft errors are reduced by forming the metal conductive layer overlaying the charge storage portion so as to have a width greater than the minimum width used in an integrated circuit at a portion thereof overlaying the substantial part of the charge storage portion. Another solution is described in U.S. Pat. No. 4,506,436 to Bakeman, Jr., et. al., whereby a buried layer, having a majority carrier concentration substantially equal to or greater than the concentration of free carriers generated by the radiation and being between one and four orders of magnitude greater concentration than that of the semiconductor substrate, is ion implanted within a few microns of the substrate surface after at least one major high temperature processing step in the manufacturing process has been completed. Previous evaluations have indicated that device shielding may provide up to a one-order magnitude reduction in failure rates.

Solutions to the alpha-particle induced soft error problem may be searched for in solutions to related causes of soft errors. One such related cause of soft error rates is known as storage decay. Storage decay occurs after a node within the dynamic logic gate has been precharged. Essentially, the node acts as a storage capacitance ($C_s$). As logic evaluations are performed in the dynamic logic gate, the precharge on the node may be "shared" with other nodes as a result of gate switching in the logic. The other nodes act as parasitic capacitances ($C_p$), depleting the precharge. As a result, the precharge may be substantially diminished and thereby cause the dynamic logic gate to convey erroneous results or otherwise malfunction.

One solution to the storage decay problem is to minimize parasitic capacitances by reducing the interstitial spacing between parallel transistor gates or by injecting charge at converging nodes. U.S. Pat. No. 5,317,204 to Yetter and Miller. This solution is not viable for the alpha-particle induced soft error problem, however, because it does not reduce or eliminate the probability of incurring alpha-particle strikes.

Another solution to the storage decay problem is described in "System and Method for Tolerating Dynamic Circuit Decay," U.S. Pat. No. 5,343,096 to Heikes and Miller. In this method, the logic state of a valid output is preserved before decay occurs using a slow clock detector configured to detect a slow clock condition of the clock pertaining to a dynamic logic circuit. A tolerant storage device is configured to preserve the data output by command of the slow clock detector upon a detection of the slow clock condition. This solution, however, requires detection of a slow clock condition and again does not reduce or eliminate the probability of incurring alpha-particle strikes.

Another solution to the storage decay problem is to insert a small feedback FET between the storage node and a voltage source. The feedback FET essentially acts like a current source to maintain the voltage potential at its rail. While this solution works well for the storage decay problem, the transient current generated by enhanced charge collection from an alpha-particle strike is too high for the feedback FET to be effective, and thus is not a viable solution to the alpha-particle induced soft error problem.

SUMMARY OF THE INVENTION

The present invention reduces the vulnerability of a dynamic logic circuit of incurring alpha soft errors by effectively trading an isolation circuit composed of only a few pn-junctions with a fast logic circuit having substantially more pn-junctions. By reducing the number of pn-junctions susceptible to alpha-particle strikes, the present invention significantly lowers the potential alpha-particle induced soft error rate. In one embodiment, isolation circuits used in the present invention are implemented using self-timed logic, to reduce the window in which a circuit is logically vulnerable to alpha strikes, in which a loss of state can occur.

In accordance with novel principles, isolation circuits are situated at the outputs of the fast portions of logic to maintain detected valid logical output values until the next refresh cycle. The essence of the invention is to trade a larger area portion of fast logic (i.e., having a large number of pn-junctions) with a smaller area isolation circuit (i.e., having a smaller number of pn-junctions) in order to reduce the probability of incurring alpha-particle strikes.

Although the novel principles of the present invention are applicable to a wide variety of dynamic logic circuits which include both fast logic portions and slow logic portions, a preferred embodiment of the present invention has particular applicability to a family of self-timed dynamic logic gates known as "mousetrap" logic gates. Self-timed mousetrap logic is known in the art, including U.S. Pat. No. 5,208,490 to Yetter, and is based on a system known as vector logic. The inherent advantages provided by mousetrap logic, including being functionally complete, self-timed, and having the ability to operate at high speed, render it particularly useful in implementing the techniques of the present invention to reduce alpha-particle induced soft errors.

DETAILED DESCRIPTION OF THE PREFERRED EMBODIMENT

In accordance with novel principles, the isolation circuit is contemplated for use in a dynamic logic circuit containing both fast and slow logic portions of the circuit. A plurality of logic isolator circuits, each corresponding to a respective fast logic portion, are situated to receive the outputs of their respective fast logic portions as an input signal. Each logic isolator circuit monitors the input signal to detect a valid logic state of the detected input signal. Upon detection of a valid logic state, the logic isolator holds the valid logic state at an output for use by subsequent circuitry. Each logic isolator is implemented with substantially fewer pn-junctions than its corresponding fast logic portion. The essence of the invention is to trade a larger area portion of logic with a smaller area isolation circuit in order to reduce the probability of incurring alpha-particle strikes.

Figure 1:
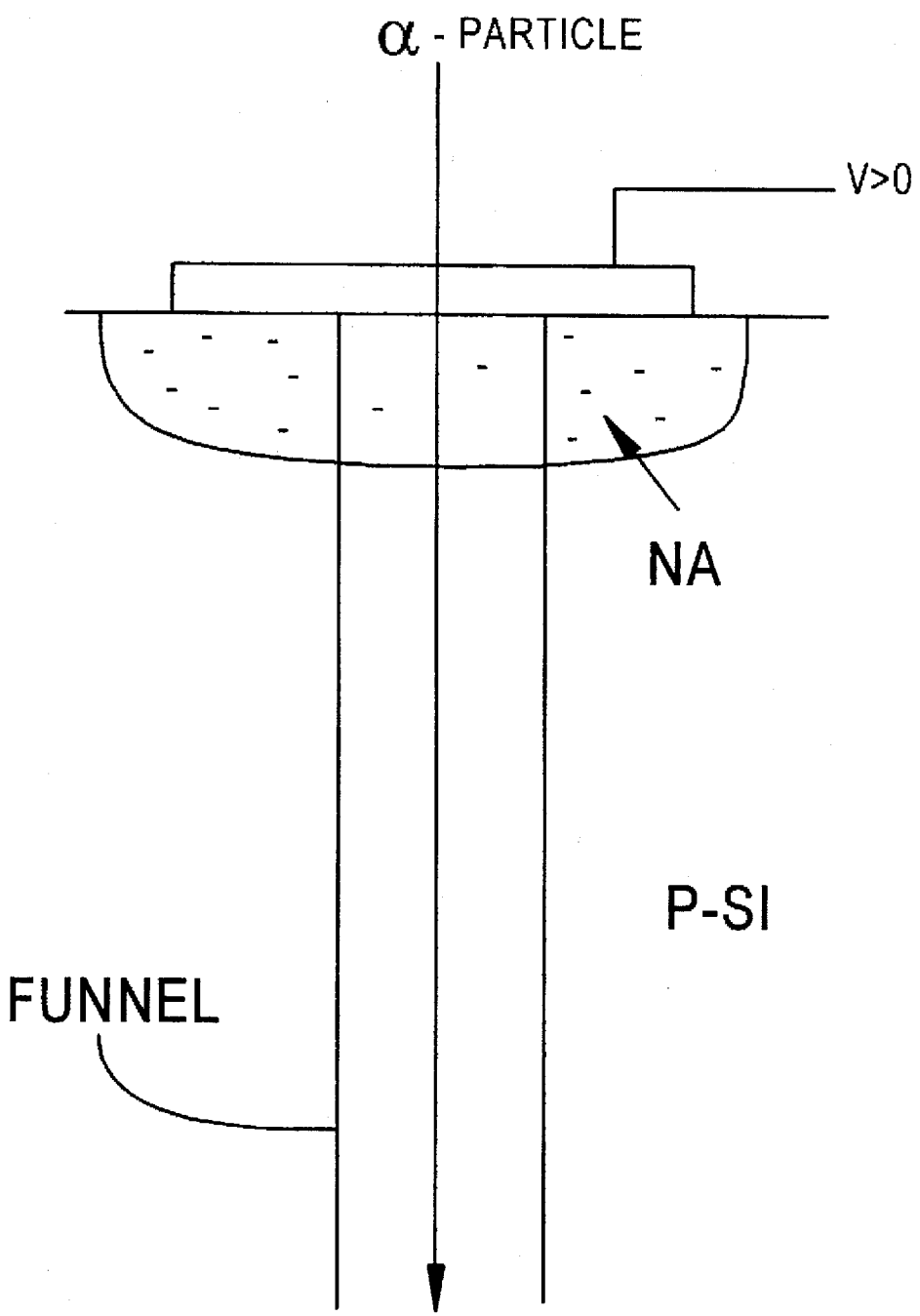
FIG. 1 illustrates the effect of an alpha-particle strike on a pn-junction, and in particular, the funneling effect due to enhanced charge collection.
Figure 2:
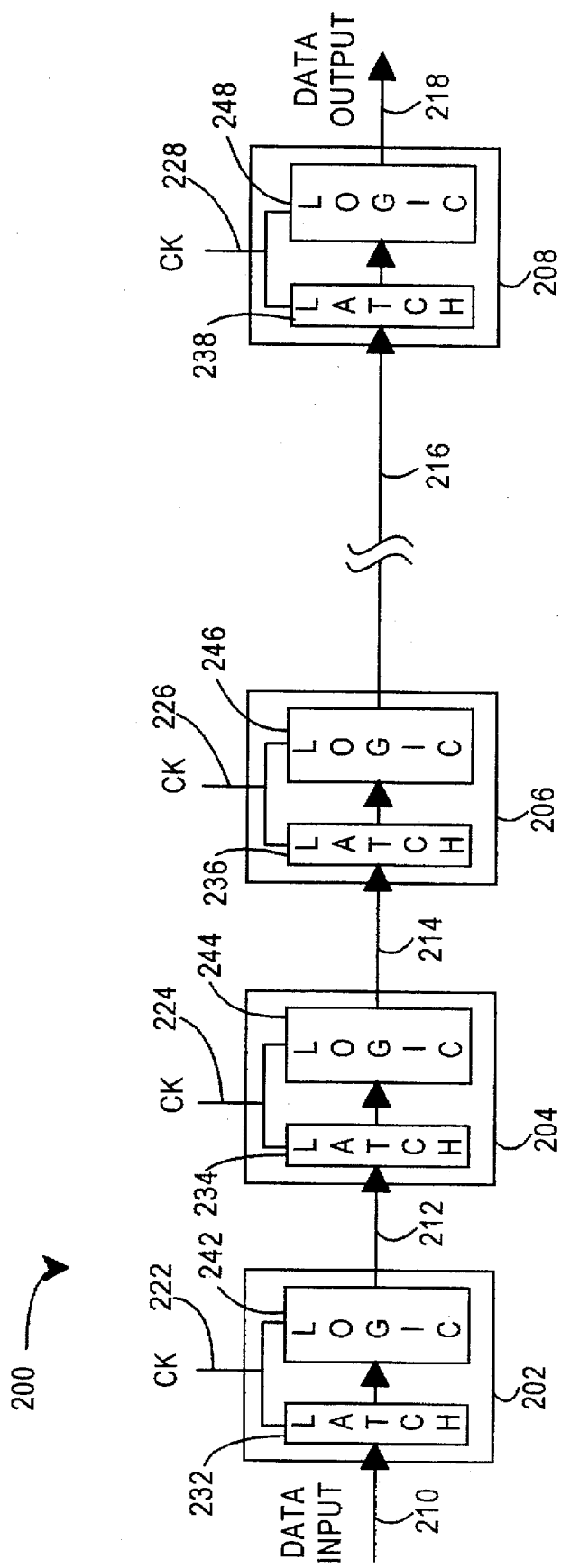
FIG. 2 shows a typical logic pipeline, composed of a series of serially arranged data latches and corresponding logic blocks.

The present invention may be best understood by first examining a typical dynamic logic circuit. FIG. 2 shows a portion of a typical dynamic logic circuit, arranged in a pipeline 200, composed of a plurality of serially arranged pipeline stages 202–208, each pipeline stage including an input data latch 232–238 and a corresponding logic block 242–248. Each of the pipeline stages 202–208 comprises any number of stages of logic gates. Data is introduced into the pipeline 200 as indicated by arrow 210. The data ultimately travels through and is independently processed by each of the pipeline stages 202–208 of the sequence, as shown by successive arrows 212–218.

Data is clocked through the pipeline 200 via clocks 222–228, which could be identical or staggered in phase as desired. Usually, successive pipeline stages are uniformly triggered by the same clock edge (either rising or falling) and are clocked a full cycle (360 degrees) out of phase.

Figure 3:
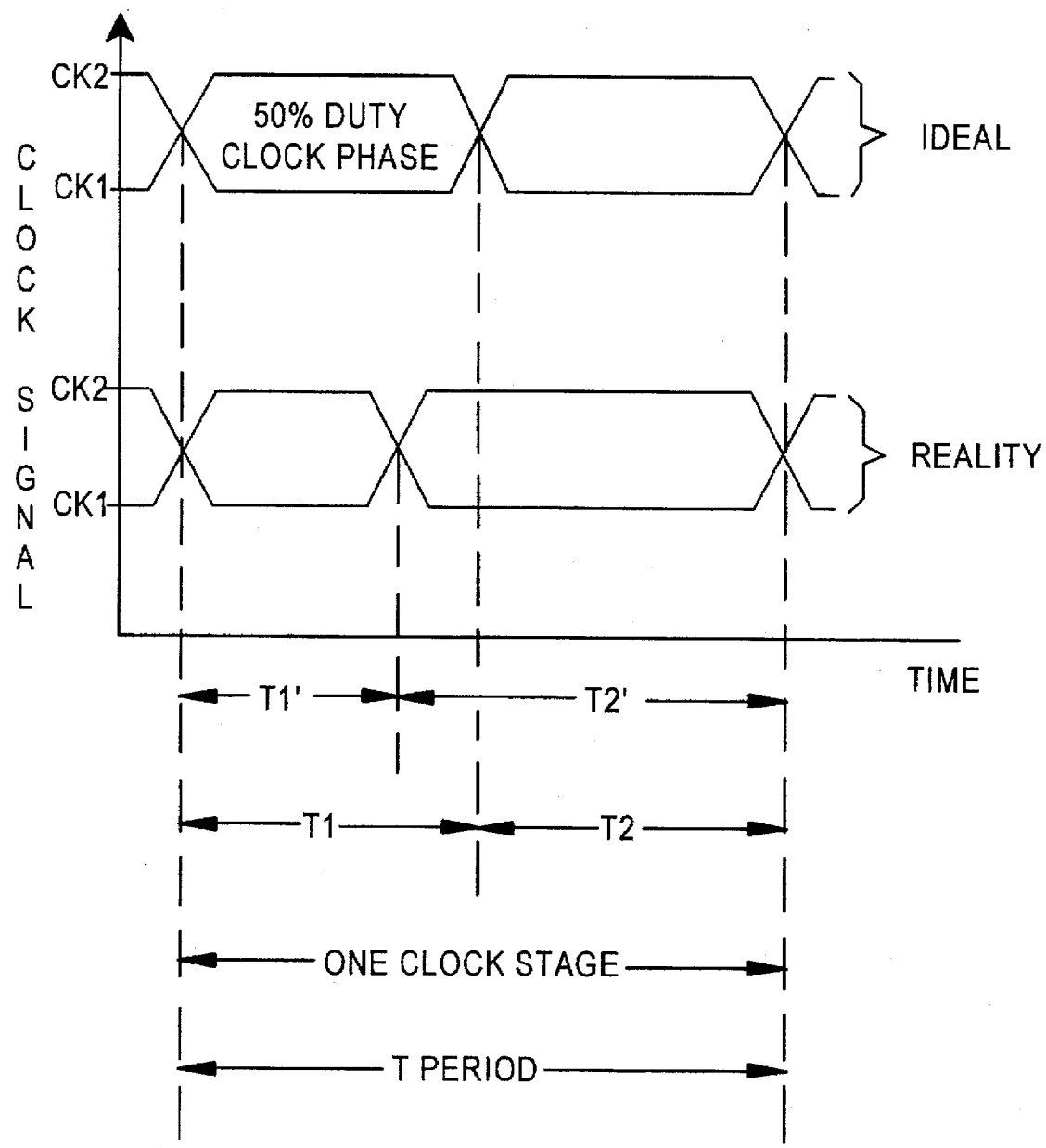
FIG. 3 shows a timing diagram including the clock and data signals of the typical logic pipeline shown in FIG. 2.

FIG. 3 shows a timing diagram including the clock and data signals of the typical logic pipeline shown in FIG. 2. As shown in FIG. 2, each consecutive pipeline stage 202–208 is clocked by alternating complementary clock signals CK1 and CK2 which, as indicated in FIG. 3, are ideally staggered 180 degrees out of phase. Ideally, clocks CK1 and CK2 are intended by design to switch simultaneously, to be alternating (180 degrees out of phase), and to have a 50 percent duty cycle with respect to one clock state ($t_{period}$) of the system clock. However, because of unavoidable clock asymmetry, due to such factors as inherent physical inequities in the manufacture of clock generation circuits, a 50 percent duty cycle cannot exist in reality.

With respect to FIG. 2, pipelining means that new data is clocked into the pipeline 200, as indicated by the arrow 210, while old data is still remaining in the pipeline 200 being processed. Pipelining increases the useful bandwidth of high latency logic networks.

Figure 4:
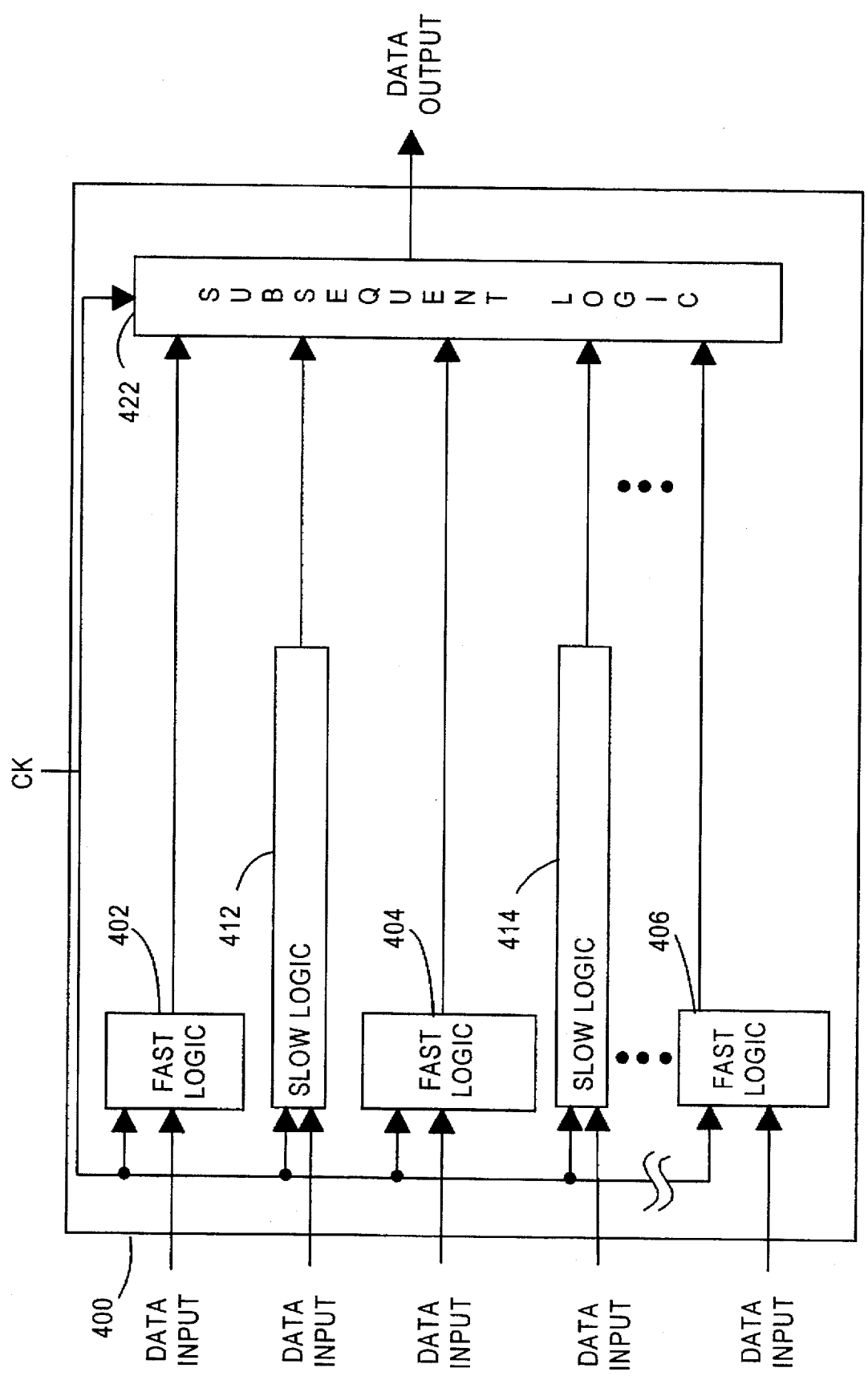
FIG. 4 shows a block diagram of a typical logic block of the typical logic pipeline of FIG. 2, including a plurality of slow and fast logic portions.

A typical logic block of the typical logic pipeline of FIG. 2 is shown in FIG. 4. As seen from FIG. 4, a typical logic block includes a plurality of slow 412, 414 and fast 402, 404, 406 logic portions. In general terms, fast logic portions contain fewer gate delays than slow logic portions. Typically, slow logic portions implement logic functions requiring either serial propagation or a large fan-in of inputs. Thus, the processing time from input to output is longer for slow logic portions 412, 414 than it is for the fast logic portions 402, 404, 406, and valid logic output values for the fast logic portions 402, 404, 406 are available to subsequent circuitry before valid logic output values for the slow logic portions 412, 414. When subsequent logic circuitry 422 depends on valid output values from both slow and fast logic portions, the valid output values for the dependent fast logic portions 402, 404, 406 must remain valid and correct while waiting for valid output values from the dependent slow logic portions 412, 414. During this waiting period, the dependent fast logic portions 402, 404, 406 are susceptible to alpha-particle strikes. If any logic gate (i.e., pn-junction) in the fast logic portions 402, 404, 406 incur an alpha-particle strike, an alpha-particle soft error may be induced and propagated to the output of the fast logic portion, causing a soft error in the output value of the fast logic portion. When the slow logic portions 412, 414 produce valid output values, the incorrect output value of the fast logic portion which incurred the alpha-particle strike is then propagated to the subsequent logic circuitry 422. The soft error is propagated through subsequent circuitry.

In dynamic logic circuits, alpha-particle strikes to the dependent slow logic portions 412, 414 is somewhat less problematic. Since the slow logic portions are critical-path, the subsequent logic circuitry 422 utilizes their valid output values almost immediately upon becoming valid (i.e., with negligible delay, less than 100 psec). Thus, the occurrence of an alpha-particle induced soft error depends on whether the alpha-particle strikes before or after the stricken logic gate has received and propagated valid data. If the stricken logic gate has already received and propagated valid data when the alpha-particle strikes, any induced soft-error will be propagated behind the valid data to the output of the slow logic portion with at least a 100 psec delay. Once the soft error is propagated to the output of the critical-path slow logic portion, the subsequent logic circuitry 422 has already accepted the correct valid output value and cannot accept further input until the subsequent logic circuitry 422 has been refreshed by the clock. However, if the striken logic gate has not yet received and propagated valid data at the time the alpha-particle strikes, any induced soft-error will be propagated ahead of the valid data to the output of the slow logic portion. Thus, alpha-induced soft errors are not completely eliminated by the present invention, but the probability of incurring alpha-particle induced soft errors is greatly reduced.

Figure 5:
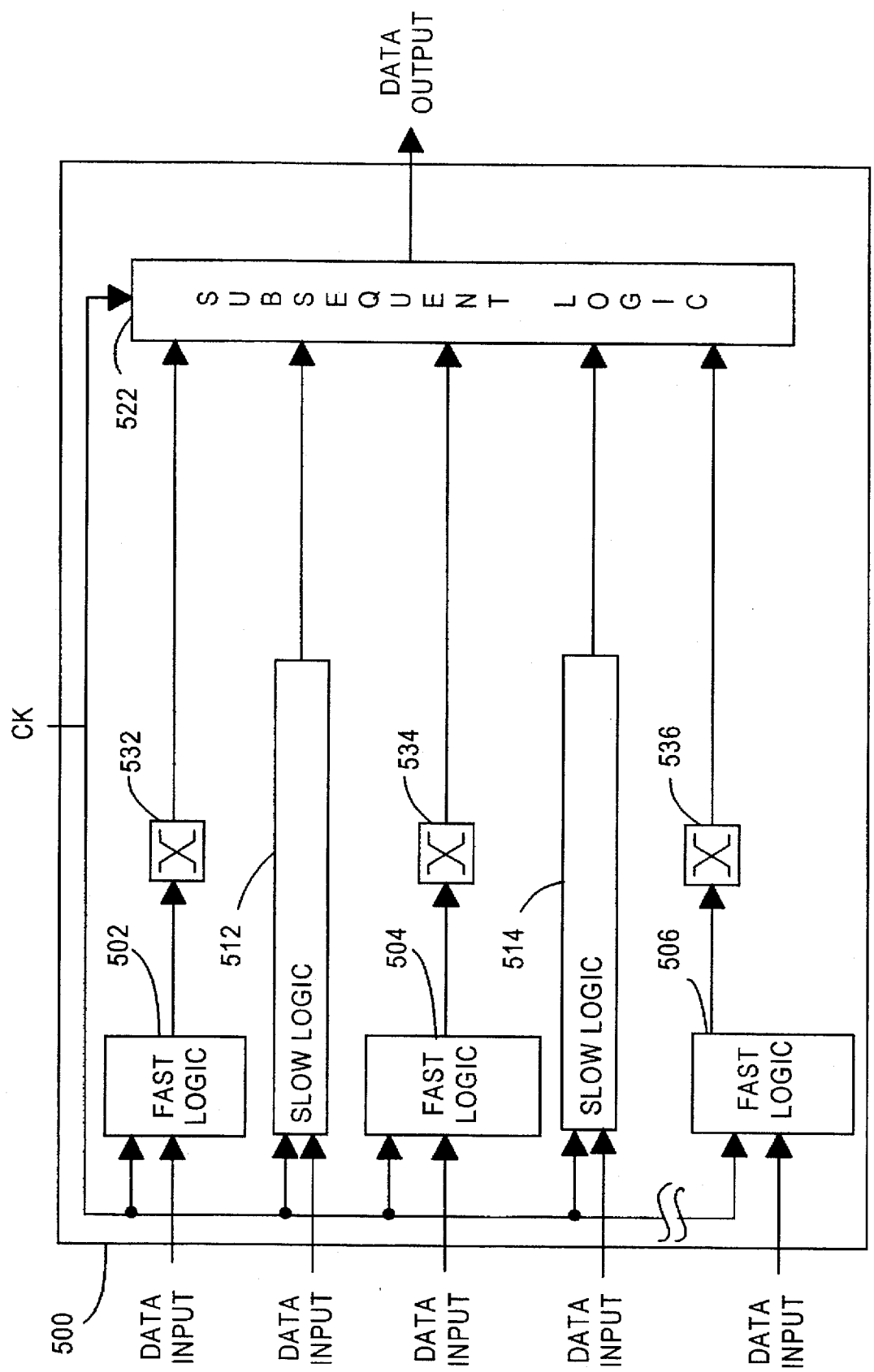
FIG. 5 shows a block diagram of a logic block embodying the present invention.

FIG. 5 shows a block diagram of a logic block embodying the present invention. As shown in FIG. 5, the logic block 500 of the present invention also includes a plurality of slow logic portions 512, 514 and a plurality of fast logic portions 502, 504, 506. In addition, the logic block 500 includes subsequent logic circuitry 522 which depends on valid output values from each of the slow 512, 514 and fast 502, 504, 506 logic portions. The essence of the present invention involves the use and placement of isolation circuits 532, 534, 536 at the output of each fast logic portion 502, 504, 506. The isolation circuit 532, 524, 536 contemplated by the present invention detects a valid input value. Upon detection of a valid input value, the isolation circuit 532, 534, 536 holds the valid input value at its output until refreshed by the clock signal CK, and ignores subsequent changes in input values. Thus, alpha-particle induced soft errors incurred by any of the logic gates of the fast logic portions 502, 504, 506 after a valid output value has been produced, and thereafter isolated by the associated isolation circuit 532, 534, 536, will be propagated to the input of the isolation circuit 532, 534, 536, but will be ignored. The correct valid output value of the soft-error producing fast logic portion shall be maintained at the output of the associated isolation circuit 532, 534, 536.

As will be appreciated from the preceding discussion, the isolation circuits 532, 534, 536 act to reduce alpha-particle induced soft errors by essentially trading the probability of alpha-particles striking a smaller number of pn-junctions of the isolation circuit with the probability of alpha-particles striking a larger number of pn-junctions of a fast logic portion. It will be appreciated by a person skilled in the art that a logic block may include any of an infinite variety of logic structures, including fast and/or slow logic portions arranged in any number of levels of dependent and/or independent subsequent logic circuits. Thus, the amount of reduction in alpha-particle induced soft-error rates is dependent upon the structure and type of logic implemented in the logic block.

Figure 6:
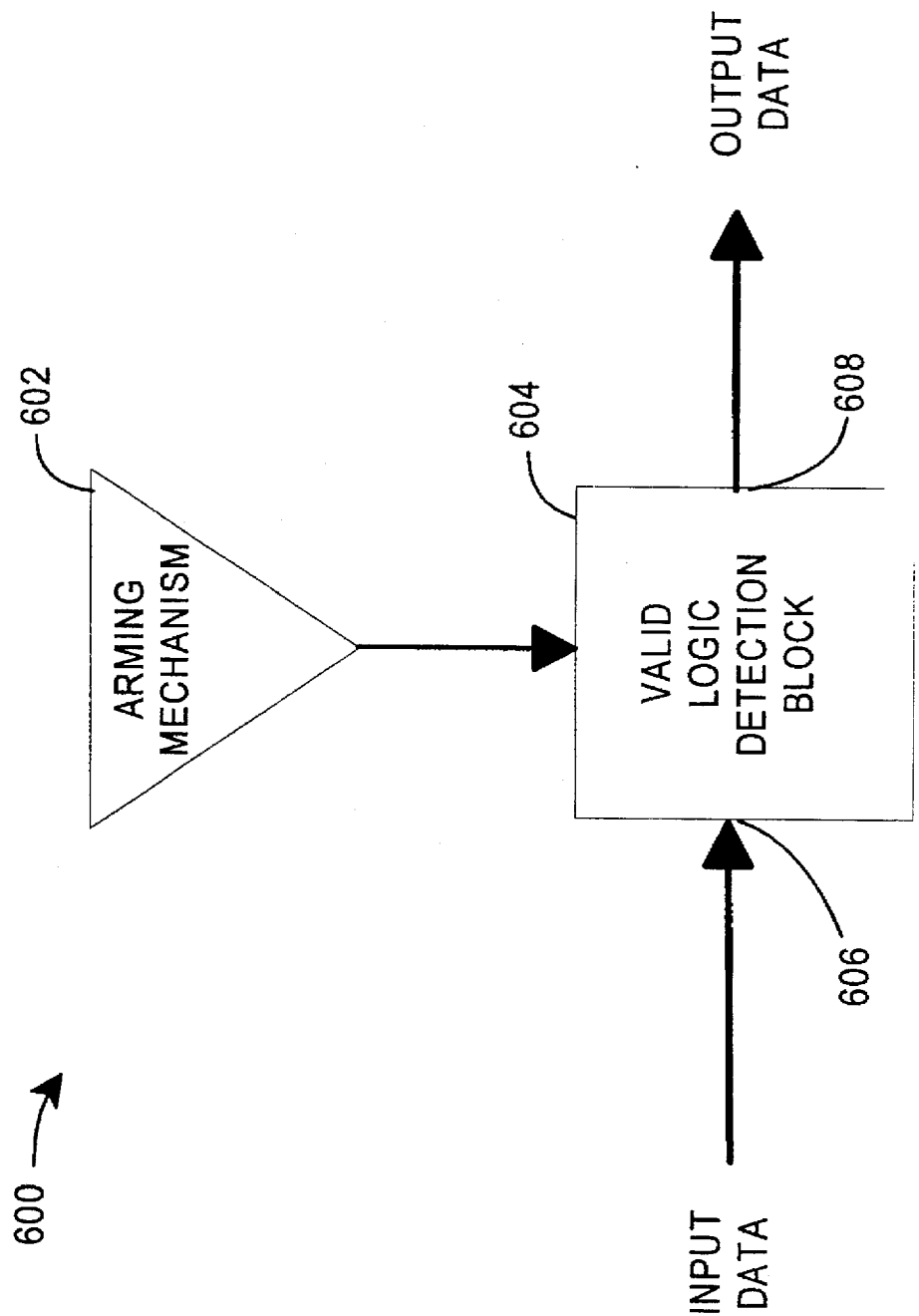
FIG. 6 shows a block diagram of an isolation circuit in accordance with the present invention.

FIG. 6 illustrates an isolation circuit 600 in accordance with the present invention. As shown in FIG. 6, it is contemplated that the isolation circuit 600 should include an arming mechanism 602, and a valid logic detection block 604. The arming mechanism 602 indicates to the valid logic detection block 604 to begin looking for a valid input value at its input 606. A valid input value triggers the valid logic detection block 604 to hold the valid input value at its output 608, and to ignore subsequent input values. In one preferred embodiment, the arming mechanism 602 is implemented with the dynamic logic system refresh clock, and the valid logic detection block 604 is implemented with "mousetrap" logic based on vector logic as discussed hereinafter.

The isolation circuits of the present invention may be implemented using any appropriate switching and logic detection mechanisms. A preferred embodiment, implemented for use in vector logic systems, is described in detail below.

The preferred embodiment of the present invention is directed to reducing alpha-particle soft error rates in dynamic logic circuits, for example but not limited to, a self-timed vector logic system with mousetrap logic gates. A complete discussion of self-timed vector logic may be found in "Self-Timed Clocking System and Method for Self-Timed Dynamic Logic Circuits", U.S. Pat. No. 5,329,176, to Miller, Jr. et al. The advantage of using self-timed vector logic for implementing the present invention is that two significant features can be determined from each vector output: (1) when the vector output is valid, thereby eliminating the need for a conventional valid clock signal, and (2) the value of the vector output when it is valid. Thus, using self-timed vector logic, the isolation circuit is armed at the beginning of a refresh cycle, and is triggered to hold the value of the vector input when it is determined to be valid. A change in input value is thereafter ignored. Alpha-particle induced errors resulting from alpha-particle strikes to a logic gate after the logic gate has detected and propagated valid data will always be at least 100 psec behind the valid values, so they also are ignored and soft-error propagation is halted by the isolation circuit.

For a better understanding of the preferred embodiment isolation circuit, a brief discussion follows in regard to the fundamental principles of self-timed mousetrap logic gates.

Typically, logic in a computer is encoded in binary fashion on a single logic path, which is oftentimes merely an electrical wire or semiconductor throughway. By definition, a high signal level, usually a voltage or current, indicates a high logic state (in programmer's language, a "1" or a "logic high"). Moreover, a low signal level indicates a low logic state (in programmer's language, a "0" or a "logic low").

By using mousetrap logic gates, "vector logic" may be implemented. Vector logic is a logic configuration where more than two valid logic states may be propagated through the logic gates in a computer. Unlike conventional binary logic having two valid logic states (high, low) defined by one logic path, the vector logic dedicates more than one logic path for each valid logic state and permits an invalid logic state.

For example, in accordance with one embodiment, in a vector logic system requiring two valid logic states, two logic paths are necessary. When both logic paths are at a logic low, i.e., "0,0", an invalid logic state exists by definition. Moreover, a logic high existing exclusively on either of the two logic paths, i.e., "1,0" or "0,1", corresponds with the two valid logic states of the vector logic system. Finally, the scenario when both logic paths are high, i.e., "1,1", is an undefined logic state in the vector logic system.

In a vector logic system requiring three logic states in accordance with another embodiment, three logic paths would be needed, and so on. In conclusion, in accordance with the foregoing embodiment, a vector logic system having n valid logic states and one invalid state comprises n logic paths.

Furthermore, encoding of vector logic states could be handled by defining a valid vector logic state by a logic high on more than one logic path, while still defining an invalid state when all paths exhibit a low logic signal. In other words, the vector logic states are not mutually exclusive.

For example, in a vector logic system using a pair of logic highs to define each valid vector logic state, the following logic scheme could be implemented. With three logic paths, "0,1,1" could designate a vector logic state 1, "1,0,1" a vector logic state 2, and "1,1,0" a vector logic state 3. With four logic paths, six valid vector logic states could be specified. Specifically, "0,0,1,1" could designate a logic state 1, "0,1,0,1" a logic state 2, "1,0,0,1" a vector logic state 3, "1,0,0,1" a vector logic state 3, "0,1,1,0" could designate a vector logic state 4, "1,0,1,0" a vector logic state 5, and "1,1,0,0" a vector logic state 6. With five logic paths up to ten valid vector logic states could be specified, and so on.

As another example, a vector logic system could be derived wherein three logic highs define each valid vector logic state. In conclusion, as is well known in the art, the above vector schemes can be summarized by a mathematical combination formula. The combination formula is as follows:

$$i = \frac{n!}{m!(n-m)!}$$

where variable n is the number of logic paths (vector components), variable m is the number of logic paths which define a valid vector logic state (i.e., the number of logic paths which must exhibit a logic high to specify a particular vector logic state), and variable i is the number of possible vector logic states.

Figure 7:
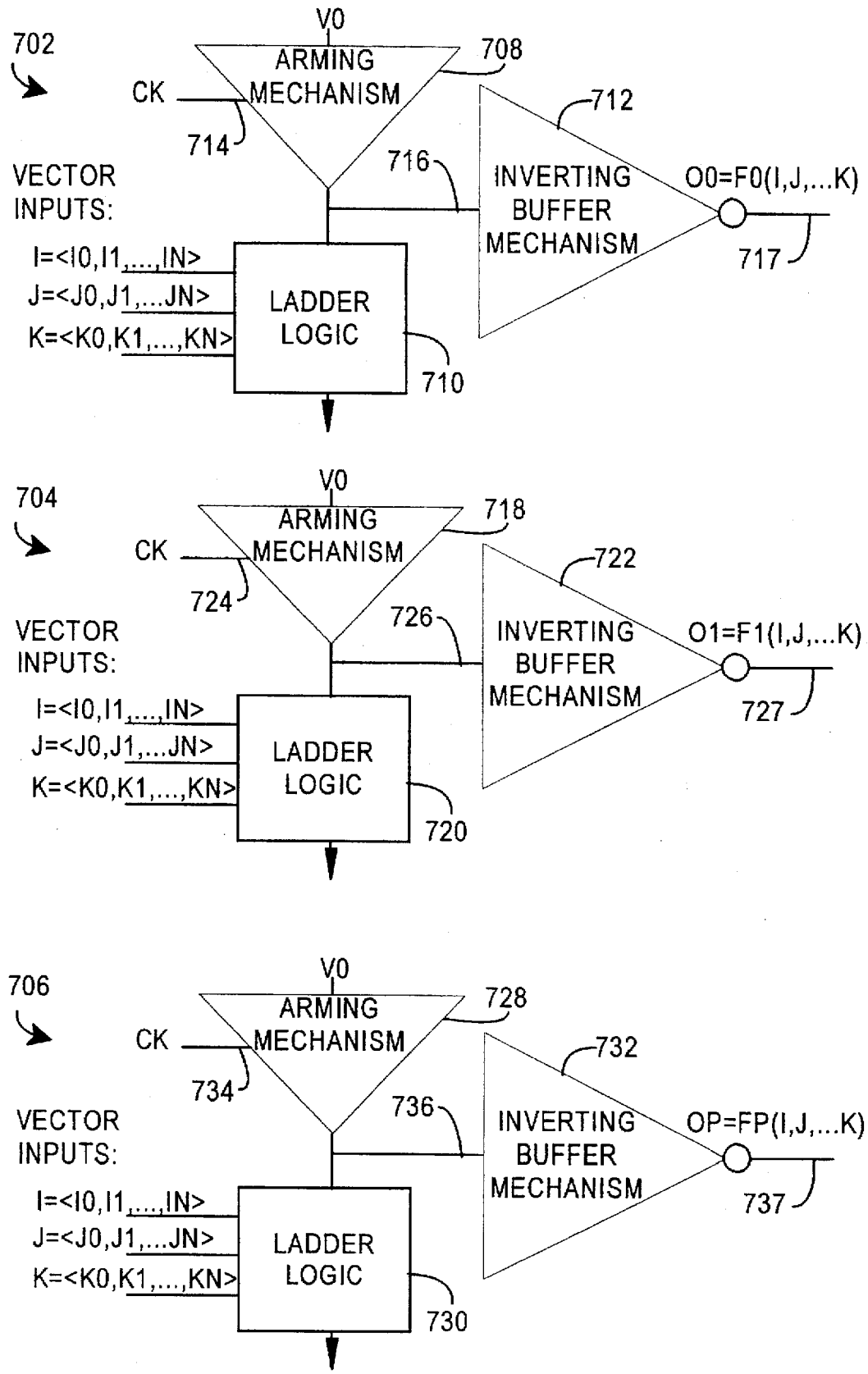
FIG. 7 illustrates a high level block diagram of a family of mousetrap logic gates.

FIG. 7 illustrates a high level block diagram of the family of mousetrap logic gates. Mousetrap logic gates, described in detail hereinafter, can implement vector logic at high speed, are functionally complete, are self-timed, and do not suffer adverse logic reactions resulting from static hazards when chained in a sequence of stages.

As shown in FIG. 7, each input to the mousetrap logic gate 700 is a vector, denoted by vector inputs I, J, . . . K (hereinafter, vectors are in bold print). No limit exists as to the number of vector inputs I, J, . . . , K. Further, each of vector inputs I, J, . . . , K may be specified by any number of vector components, each vector component having a dedicated logic path denoted respectively in FIG. 7 by $I_O$–$I_N$, $J_O$–$J_M$, and $K_O$–$K_S$.

Essentially each vector input specifies a vector logic state. As mentioned previously, an invalid vector logic state for any of the input vectors I, J, . . . , K is present by definition when all of its corresponding vector components, respectively, $I_O$–$I_N$, $J_O$–$J_M$, and $K_O$–$K_S$, are at a logic low.

The output of the generic mousetrap logic gate 700 is also a vector, denoted by a vector output O. The vector output O is comprised of vector components $O_O$–$O_P$. The vector components $O_O$–$O_P$ are mutually exclusive and are independent functions of the vector inputs I, J, . . . , K. Further, the vector components $O_O$–$O_P$ have dedicated mousetrap gate components 702–706, respectively, within the mousetrap logic gate 700. By definition, one and only one of the $O_O$–$O_P$ is at a logic high at any particular time.

Moreover, no limit exists in regard to the number of vector components $O_O$–$O_P$ which can be associated with the output vector O. The number of vector components $O_O$–$O_P$, and thus mousetrap gate components 702–706 depends upon the logic function to be performed on the vector inputs individually or as a whole, the number of desired vector output components, as well as other considerations with respect to the logical purpose of the mousetrap logic gate 700.

With reference to FIG. 7, each mousetrap gate component 702–706 of the mousetrap logic gate 700 comprises an arming mechanism 708, ladder logic 710, and an inverting buffer mechanism 712. The arming mechanism 708 is a precharging means, or energizing means, for arming and resetting the mousetrap logic gate 700.

The arming mechanism 708 essentially serves as a switch to thereby selectively impose a voltage $V_O$ defining a logic state on a line 716 upon excitation by a clock signal (high or low) on line 714. As known in the art, any type of switching element or buffer for selectively applying voltage based upon a clock signal can be used. Furthermore, when the logic of a computer system is based upon current levels, rather than voltage levels, then the arming mechanism 708 could be a switchable current source, which is also well known in the art. Any embodiment serving the described switching function as the arming mechanism 708 is intended to be incorporated herein.

The ladder logic 710 is designed to perform a logic function on the vector inputs I, J, . . . K. The ladder logic 710 corresponding to each mousetrap gate component 702–706 may vary depending upon the purpose of each mousetrap gate component 702–706. In the preferred embodiment, the ladder logic 710 is essentially a combination of simple logic gates, for example, logic OR gates and/or logic AND gates, which are connected in series and/or parallel. It should be noted that the ladder logic 710 is configured so that one and only one of the vector components $O_O$–$O_P$ is at a logic high at any sampling of a valid vector output O.

The ladder logic 710 must operate at high speed because it resides in the critical logic path, unlike the arming mechanism 708 which initially acts by arming the mousetrap gate component, but then sits temporarily dormant while data actually flows through the mousetrap gate component, i.e., through the critical logic path. Furthermore, because the ladder logic 710 resides in the critical logic path which is essentially where the logical intelligence is positioned, a plurality of logic gates are generally required to implement the desired logic functions.

Also residing in the logic path is the inverting buffer mechanism 712. The inverting buffer mechanism 712 primarily serves as an inverter because in order to provide complete logic functionality in the mousetrap gate 700, it is necessary to have an inversion function in the critical logic path. Moreover, the inverting buffer mechanism 712 provides gain to the signal residing on line 714 and provides isolation between other potential stages of mousetrap gate components similar to the mousetrap logic gate components 702–706 of FIG. 7. The inverting buffer mechanism 712 is characterized by a high input impedance and low output impedance. Any buffer embodiment serving the described function as the buffer mechanism 712 is intended to be incorporated herein.

The operation of the mousetrap logic gate 700 is described below at a high conceptual level in regard to only the mousetrap gate component 702 for simplicity. The narrowing of the present discussion is well grounded because the various mousetrap gate components 702–706 are essentially redundant with the exception of their corresponding ladder logic functions implemented by ladder logics 710, 720, and 730. Consequently, the following discussion is equally applicable to the remaining mousetrap gate components 704 and 706.

In operation, upon excitation by a clock CK on the line 714, the arming mechanism 708 pulls up, or drives, the output 716 of the ladder logic 710 to a logic high. Concurrently, the arming mechanism 708 pulls the input at line 714 to the inverting buffer mechanism 712 to a logic high. Consequently, the corresponding vector component $O_O$ on a line 717 is maintained at a logic low, defined as an invalid state. In the foregoing initial condition, the mousetrap logic gate 700 can be analogized as a "mousetrap", in the traditional sense of the word, which has been set and which is waiting to be triggered by the vector inputs I, J, . . . , K.

The mousetrap logic gate 700 will remain in the armed predicament with the vector component $O_O$ in the invalid state, until being triggered by the ladder logic 710. The mousetrap logic gate 700 is triggered upon receiving enough valid vector inputs I, J, . . . , K to definitively determine the correct state of the vector component $O_O$ on the line 717. The number of vector inputs I, J, . . . K needed to make the definitive determination of the output state and also the timing of the determination is defined by the content and configuration of the simple logic gates within the ladder logic 710.

After the vector component $O_O$ on line 717 is derived, it is passed onto the next stage (not shown) of logic. The mousetrap logic gate component 702 will not perform any further function until being reset, or re-armed, or refreshed, by the arming mechanism 708. In a sense, the timing from mousetrap gate component to mousetrap gate component as well as gate to gate depends upon the encoded data itself. In other words, the mousetrap gate components are "self-timed."

Mousetrap logic gates directly perform inverting and non-inverting functions. Consequently, in contrast to conventional dynamic logic gates, mousetrap logic gates can perform multiplication and addition, which require logic inversions, at extremely high speeds.

Finally, it should be noted that the family of mousetrap logic gates 700 can be connected in electrical series, or cascaded, to derive a combinational logic gate which will perform logic functions as a whole. Thus, a mousetrap gate component, comprising an arming mechanism, ladder logic, and an inverting buffer mechanism, can be conceptualized as the smallest subpart of a mousetrap logic gate. Moreover, various mousetrap gate components can be connected in series and/or in parallel to derive a multitude of logic gates.

In a vector logic system, a mousetrap logic gate as described with respect to FIG. 7 provides an ideal isolation circuit device for reducing alpha-particle induced soft errors in fast logic portions in accordance with the present invention. As described in detail with respect to FIG. 7, the mousetrap logic gate includes an arming mechanism which is armed to begin detection of a valid input logic vector. Detection of a valid input vector triggers the mousetrap logic gate to hold the valid output vector at its output, and to ignore any further changes of the input vector, until it is rearmed.

Figure 8:
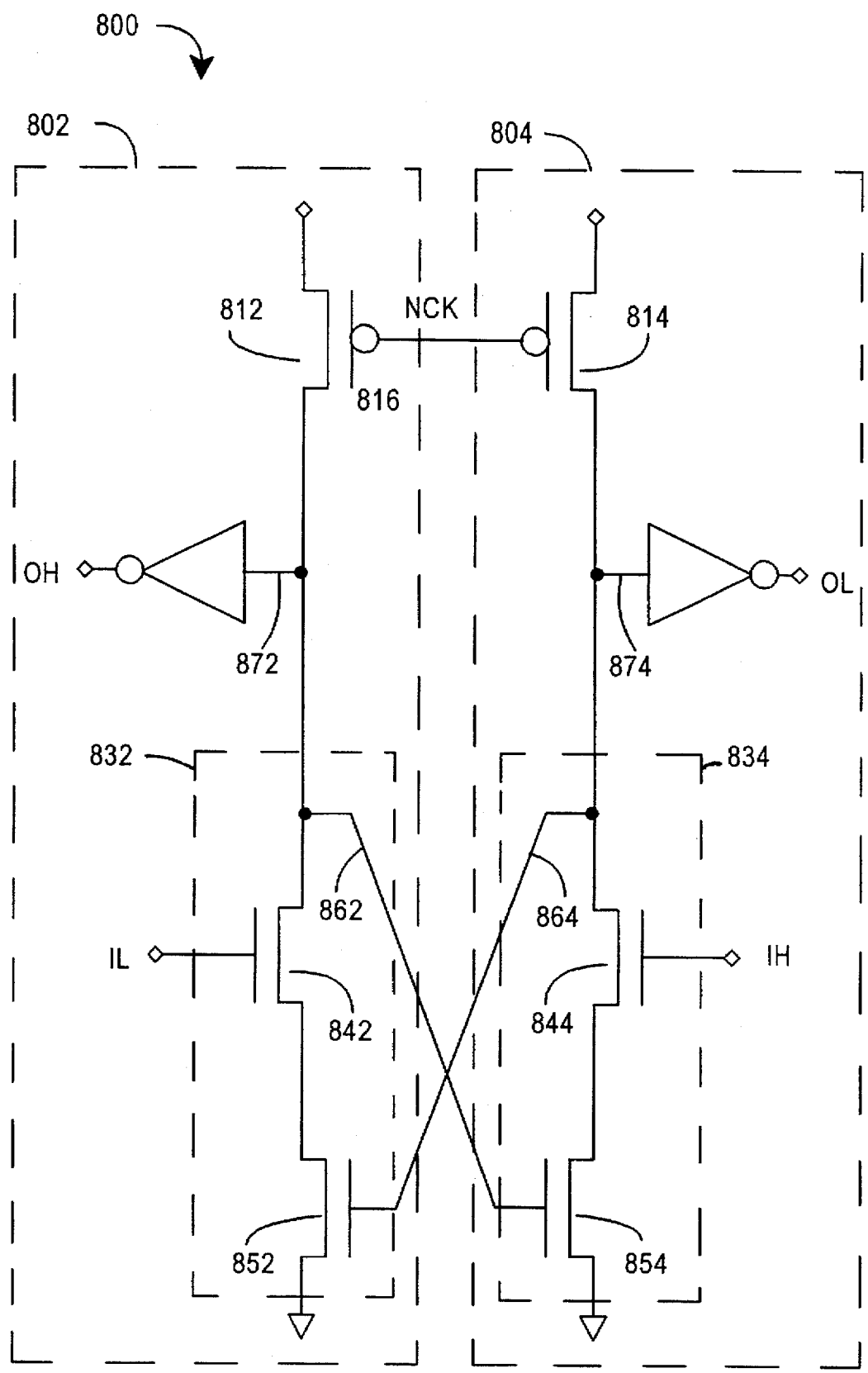
FIG. 8 illustrates a preferred embodiment isolation circuit, using mousetrap logic gates, for use in the present invention.

FIG. 8 shows a preferred embodiment of an isolation circuit 800 for use in a vector logic system, which is implemented using mousetrap logic gates 802, 804 in accordance with the present invention. As shown in FIG. 8, the isolation circuit 800 receives a 2-input vector IL, IH. Thus, according to the vector logic system in which the isolation circuit 800 in FIG. 8 operates, there are only two valid states: "1,0" and "0,1".

A truth table indicating the operation of the isolation circuit 800 is set forth in Table A below.

TABLE A

| i   | o   | IH | IL | OH | IL |
|-----|-----|----|----|----|----|
| inv | inv | 0  | 0  | 0  | 0  |
| 0   | 0   | 0  | 1  | 0  | 1  |
| 1   | 1   | 1  | 0  | 1  | 0  |

As indicated in Table A and shown in FIG. 8, vector input i specifies a vector logic state defined by two vector components IH and IL. The designation "inv" indicates an invalid vector logic state. Furthermore, vector output o specifies a vector logic state defined by two outputs OH and OL. In vector notation, the vectors are defined as: i=<IH, IL>; o=<OH,OL>.

As shown in FIG. 8, the isolation circuit 800 is implemented with two mousetrap gate components 802, 804, having respective arming mechanisms 812, 814 as well as inverting buffer mechanisms 822, 824. In the preferred embodiment, the arming mechanisms 812, 814 are p-channel metal-oxide-semiconductor field-effect transistors (MOSFETs), as shown in FIG. 8, which are well known in the art and are commercially available. As will be appreciated by one skilled in the art, n-channel MOSFETs could be substituted for the p-channel MOSFETs; however, the clocking obviously would be diametrically opposite. In addition, in the preferred embodiment isolation circuit shown in FIG. 8, the inverting buffer mechanisms 822, 824 are implemented with static CMOSFET inverters, which are also well known in the art and are commercially available.

Each of the mousetrap logic components 802, 804 also comprise ladder logic blocks 832, 834. Each ladder logic block 832, 834, includes an input trigger disabling mechanism 852, 854, and an input trigger mechanism 842, 844. A cross-over network, denoted by reference numerals 862, 864, has been implemented to create a flip-flop latch operation. As shown in FIG. 8, the preferred embodiment isolation circuit utilizes n-channel MOSFETs, as shown. N-channel MOSFETs provide superior drive capabilities, space requirements, and load specifications, than comparable p-channel MOSFETs. A typical n-channel MOSFET can generally switch approximately fifty percent faster than a comparable pchannel MOSFET having similar specifications. However, it will be appreciated by one skilled in the art that the ladder logic may be implemented using p-channel MOSFETs, which obviously will reverse the polarity of the signals in the logic ladder.

The operation of the preferred embodiment isolation circuit of the present invention is as follows. With reference to FIG. 8, the MOSFETs comprising the arming mechanisms 812, 814 essentially serve as switches to thereby impose a voltage $V_o$ on respective lines 872, 874 upon excitation by a low clock signal NCK on line 816. As known in the art, any type of switching element for voltage can be used.

The respective cross-over network lines 862, 864 impose voltage $V_o$ at the respective gates of the input trigger disabling mechanisms 852, 854, implemented with n-channel MOSFETs. The voltage $V_o$ at the gate of n-channel MOSFETs 852, 854 disables the input trigger disabling mechanisms 852, 854. The input trigger disabling mechanisms 852, 854 are reset by turning on the n-channel MOSFET switches 852, 854, thereby biasing the sources of n-channel MOSFET input trigger mechanisms 842, 844 to approximately 0.7 V. Assuming initially that a valid input state <IH, IL> is not yet available, and that <IH, IL>=<0,0>, the n-channel MOSFET input trigger mechanisms 842, 844 remain off, thereby isolating the respective lines 872, 874 to the inverting buffer mechanisms 822, 824 from the input vector <IH, IL>.

Upon presentation of a valid input vector, <IH, IL>=<0,1> or <1,0>, the input trigger mechanisms 842, 844 are triggered to cause the output vector <OH, OL> at the output of the inverting buffer mechanisms 822, 284 to hold the value of the input vector <IH, IL>. Further, the input trigger disabling mechanisms 852, 854 are triggered to disallow recognition of further input vectors until rearmed by the respective arming mechanisms 812, 814.

For example, if the valid input vector <IH, IL> is <0,1>, input trigger mechanism 844 turns on, pulling line 874 low. This causes the inverted buffer mechanism 824 to invert the low signal on line 874 and to hold output vector component OL high. Simultaneously, the low voltage on line 874 pulls the gate of input trigger disabling mechanism 852 low, via cross-over line 862. This disables recognition of further input vectors <IH, IL> until reset again (i.e. turned on), as follows. Since the input vector component IL is low, input trigger mechanism 842 remains off, causing line 872 to remain high. Thus, the inverted buffer mechanism 822 inverts the high signal on line 872 and holds output vector OH low. If input vector component IL switches high after the input trigger disabling mechanism 852 is triggered (i.e., it is turned off) and before it is reset, line 872 will remain high because input trigger disabling mechanism 852 isolates it from ground. If input vector component IH switches low before the mousetrap gate 804 is refreshed by the clock signal NCK to arming mechanism 814, line 874 will remain low even though input triggering mechanism 844 turns off. Thus, changes in the input vector components after a valid input vector is detected are ignored until the mousetrap logic gates 802, 804 are refreshed by clock signal NCK to arming mechanisms 812, 814.

The operation of the isolation circuit 800 in FIG. 8 where input vector <IH, IL> is <0,1>, is similar, but diametrically opposite.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A dynamic logic circuit having improved alpha soft-error resistance, comprising a plurality of fast logic portions;

a plurality of slow logic portions; and a plurality of logic isolator circuits, each logic isolator circuit corresponding to a respective fast logic portion and each receiving the output of its respective fast logic portion as an input signal, and each detecting and holding a valid logic state of the detected input signal at an output, wherein each logic isolator circuit is implemented using substantially fewer pn-junctions than its corresponding fast logic portion.

2. The dynamic logic circuit of claim 1, wherein the plurality of fast logic portions, the plurality of slow logic portions, and the plurality of logic isolator circuits are embodied in a single CMOS integrated circuit.

3. The dynamic logic circuit of claim 1, each logic isolator circuit comprising an arming trigger for commencing input signal detection pursuant to a clock signal;

a valid logic signal detector for detecting a valid logic state of the input signal;

a disarming trigger for terminating input signal detection upon detection of the valid logic state; and an output isolator for holding the detected valid logic state at the logic isolator output.

4. The dynamic logic circuit of claim 3, wherein the fast logic portions and the logic isolator circuits are implemented as a vector logic system operating on vector logic signals.

5. The dynamic logic circuit of claim 4, wherein each logic isolator circuit is implemented with a latch, the latch comprising:

an input trigger mechanism for receiving the vector logic signals pursuant to the clock signal;

a flip-flop responsive to the input trigger mechanism for storing the vector logic signals;

an output gate responsive to the flip-flop pursuant to the clock signal for outputting the vector logic signals;

an input trigger disabling mechanism for disabling the input trigger mechanism upon detection of a valid vector logic signal.

6. A dynamic logic isolation circuit, directed for use in a dynamic logic circuit having fast logic portions and slow logic portions, for improving alpha soft-error resistance, comprising:

an arming trigger for commencing input signal detection pursuant to a clock signal;

a valid logic signal detector for detecting a valid logic state of the input signal;

a disarming trigger for terminating input signal detection upon detection of the valid logic state; and an output isolator for holding the detected valid logic state at the logic isolator output, the logic isolator circuit corresponding to a respective fast logic portion and being implemented with substantially fewer pn-junctions than the respective fast logic portion, the logic isolator circuit receiving the output of the respective fast logic portion as an input signal, and detecting and holding a valid logic state of the detected input signal at an output.

7. The dynamic logic circuit of claim 6, wherein the logic isolator circuit and its corresponding fast logic portion are implemented to operate on vector logic signals.

8. The dynamic logic circuit of claim 7, wherein the logic isolator circuit is implemented with a latch, the latch comprising:

an input trigger mechanism for receiving the vector logic signals pursuant to the clock signal;

a flip-flop responsive to the input trigger mechanism for storing the vector logic signals;

an output gate responsive to the flip-flop pursuant to the clock signal for outputting the vector logic signals;

an input trigger disabling mechanism for disabling the input trigger mechanism upon detection of a valid vector logic signal.

9. A method for improving alpha soft-error resistance in a dynamic logic circuit, the dynamic logic circuit having a plurality of fast logic portions and a plurality of slow logic portions, the method comprising the steps of:

(a) inserting at each fast logic portion output location a logic isolator to receive respective fast logic portion output signals from the respective fast logic portion outputs; and (b) performing logic isolation of respective valid fast logic portion output signals via the respective logic isolators, wherein each logic isolator is implemented using substantially fewer pn-junctions than its respective fast logic portion.

10. The method of claim 9, performing logic isolation in step (b) by the further steps of:

(c) arming the respective logic isolators to commence signal detection; and (d) disarming the respective logic isolators to terminate signal detection upon detection of a respective valid fast logic output signal; and (e) causing the respective logic isolators to hold the detected valid fast logic output signals at respective logic isolator outputs.

11. The method of claim 10, each logic isolator performing the steps of:

(f) commencing signal detection upon receipt of an arming signal;

(g) receiving and monitoring the fast logic output portion signal from its corresponding fast logic portion to detect valid fast logic output portion signals;

(h) terminating signal detection upon detection of a valid fast logic output portion signal; and (i) holding the respective valid fast logic output portion signal at the output of the logic isolator.

* * * * *